(12) United States Patent
Endo et al.

(10) Patent No.: US 7,195,860 B2
(45) Date of Patent: Mar. 27, 2007

(54) SEMICONDUCTOR MANUFACTURING APPARATUS AND PATTERN FORMATION METHOD

(75) Inventors: Masayuki Endo, Osaka (JP); Masaru Sasago, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 66 days.

(21) Appl. No.: 10/983,655

(22) Filed: Nov. 9, 2004

(65) Prior Publication Data

US 2005/0106512 A1 May 19, 2005

(30) Foreign Application Priority Data

Nov. 13, 2003 (JP) ............................. 2003-383784
May 17, 2004 (JP) ............................. 2004-146217

(51) Int. Cl.
*G03C 5/00* (2006.01)
(52) U.S. Cl. ............... 430/302; 430/322; 430/331; 355/30; 355/53; 359/649; 359/656
(58) Field of Classification Search ............... 430/302, 430/322, 331; 355/30, 53; 359/649, 656
See application file for complete search history.

(56) References Cited

U.S. PATENT DOCUMENTS 6,980,277 B2 * 12/2005 Sewell .................. 355/30

2006/0098297 A1 * 5/2006 Van Peski et al. .......... 359/642

FOREIGN PATENT DOCUMENTS

| JP | 06-124873 | 5/1994 |
|---|---|---|
| JP | 2001-316863 | 11/2001 |
| JP | 2003-181260 | 7/2003 |
| JP | 2003-306015 | 10/2003 |
| JP | 2004-282023 | 10/2004 |
| WO | WO 99/49504 | 9/1999 |

OTHER PUBLICATIONS

M. Switkes, et al. "Immersion lithography at 157nm", J. Vac. Sci. Technol., B 19(6), Nov./Dec. 2001, pp. 2353-2356.
Notice of Reasons for Rejection dated May 30, 2006.

* cited by examiner

*Primary Examiner*—Christopher G. Young
(74) *Attorney, Agent, or Firm*—McDermott Will & Emery LLP

(57) ABSTRACT

A semiconductor manufacturing apparatus includes a liquid supplying section for supplying a liquid onto a stage for holding a wafer on which a resist film is formed; an exposing section for irradiating the resist film with exposing light through a mask with the liquid provided on the resist film; and a removing part for removing, from the liquid, a gas included in the liquid. Thus, the liquid from which the gas has been removed is provided on the resist film, and therefore, foams included in the liquid or formed during the exposure can be removed. Accordingly, exposure abnormality such as diffraction abnormality can be prevented, resulting in forming a resist pattern in a good shape.

11 Claims, 13 Drawing Sheets

SEMICONDUCTOR MANUFACTURING APPARATUS AND PATTERN FORMATION METHOD

CROSS-REFERENCE TO RELATED APLICATIONS

This application claims priority under 35 U.S.C. §119 on Patent Application Nos. 2003-383784 and 2004-146217 respectively filed in Japan on Nov. 13, 2003 and May 17, 2004, the entire contents of which are hereby incorporated by reference.

BACKGROUND OF THE INVENTION

The present invention relates to a semiconductor manufacturing apparatus used for manufacturing semiconductor integrated circuits by employing immersion lithography and a pattern formation method using the semiconductor manufacturing apparatus.

In accordance with the increased degree of integration of semiconductor integrated circuits and downsizing of semiconductor devices, there are increasing demands for further rapid development of lithography technique. Currently, pattern formation is carried out through photolithography using exposing light of a mercury lamp, KrF excimer laser, ArF excimer laser or the like, and use of $F_2$ laser lasing at a shorter wavelength is being examined. However, since there remain a large number of problems in exposure systems and resist materials, photolithography using exposing light of a shorter wavelength has not been put to practical use.

In these circumstances, immersion lithography has been recently proposed for realizing further refinement of patterns by using conventional exposing light (for example, see M. Switkes and M. Rothschild, "Immersion lithography at 157 nm", J. Vac. Sci. Technol., Vol. B19, p. 2353 (2001)).

In the immersion lithography, a region in an exposure system sandwiched between a projection lens and a resist film formed on a wafer is filled with a liquid having a refractive index n, and therefore, the NA (numerical aperture) of the exposure system has a value n·NA. As a result, the resolution of the resist film can be improved.

Now, a conventional pattern formation method employing the immersion lithography will be described with reference to FIGS. 13A through 13D.

First, a positive chemically amplified resist material having the following composition is prepared:

| | | |
|---|---|---|
| Base polymer: | poly((norbornene-5-methylene-t-butylcarboxylate) (50 mol %) – (maleic anhydride) (50 mol %)) | 2 g |
| Acid generator: | triphenylsulfonium triflate | 0.06 g |
| Quencher: | triethanolamine | 0.002 g |
| Solvent: | propylene glycol monomethyl ether acetate | 20 g |

Next, as shown in FIG. 13A, the aforementioned chemically amplified resist material is applied on a substrate 1 so as to form a resist film 2 with a thickness of 0.35 μm.

Then, as shown in FIG. 13B, with a liquid (water) 3 provided on the resist film 2, pattern exposure is carried out by irradiating the resist film 2 with exposing light 4 of ArF excimer laser with NA of 0.68 through a mask 5.

After the pattern exposure, as shown in FIG. 13C, the resist film 2 is baked with a hot plate at a temperature of 100° C. for 60 seconds, and the resultant resist film is developed with a 2.38 wt % tetramethylammonium hydroxide developer. In this manner, a resist pattern 2a made of an unexposed portion of the resist film 2 and having a line width of 0.09 μm is formed as shown in FIG. 13D. As shown in FIG. 13D, however, the resist pattern formed by the conventional pattern formation method is in a defective shape.

SUMMARY OF THE INVENTION

The present inventors have variously examined the reason why the resist pattern formed by the conventional immersion lithography is in a defective shape, resulting in finding the following: When a movable stage provided in the exposure system for holding a wafer moves, fine foams are formed within the liquid 3, and these foams cause abnormality of aberration and diffraction of a projection lens. In particular, when the movable stage is moved with a liquid standing up above the surface of the wafer, the air is swallowed up into the liquid in the form of foams through a boundary between a resist film and the liquid.

Accordingly, when the pattern exposure is performed through the liquid including such fine foams, the resultant resist pattern is in a defective shape. For example, as shown in FIG. 13D, the resist pattern 2a formed by the conventional pattern formation method employing the immersion lithography is in a defective shape. When a resist pattern in such a defective shape is used for etching a target film, the resultant pattern of the target film is also in a defective shape, which disadvantageously lowers the productivity and the yield in the fabrication process for semiconductor devices.

In consideration of the aforementioned conventional problem, an object of the invention is forming a resist pattern in a good shape by employing the immersion lithography.

In order to achieve the object, according to the present invention, in a semiconductor manufacturing apparatus employing the immersion lithography and a pattern formation method using the apparatus, a gas included in a liquid provided on a resist film in exposure is removed.

Specifically, a degassing mechanism or a mechanism for spraying an immersion liquid is used for removing the gas.

(Aspects Using Degassing Mechanism)

The first semiconductor manufacturing apparatus of this invention using a degassing mechanism includes a stage for placing a substrate on which a resist film is formed; a liquid supplying section for supplying a liquid onto the stage; an exposing section for irradiating the resist film with exposing light through a mask with the liquid provided on the resist film; and a degassing section for removing a gas included in the liquid, and the degassing section includes a removing part for removing a gas from the liquid having been supplied from the liquid supplying section; a supplying path for supplying, onto the resist film, the liquid from which the gas has been removed; and a recovering path for recovering, to the removing part, the liquid having been supplied onto the resist film.

In the first semiconductor manufacturing apparatus, the liquid from which the gas has been removed by the degassing section is provided on the resist film, and therefore, the liquid used in the exposure includes no foams. As a result, a fine pattern can be formed in a good shape.

The second semiconductor manufacturing apparatus of this invention using a degassing mechanism includes a liquid supplying section for supplying a liquid to be provided on a stage for placing a substrate on which a resist film is formed; an exposing section for irradiating the resist film with exposing light through a mask with the liquid provided on the resist film; and a degassing section for removing, from the liquid, a gas included in the liquid, and the degassing section degases the liquid provided on the stage by the liquid supplying unit.

In the second semiconductor manufacturing apparatus, the liquid provided on the stage is degassed by the degassing section, and hence, the liquid having been degassed is provided on the resist film. Therefore, the liquid used in the exposure includes no foams. As a result, a fine pattern can be formed in a good shape.

The third semiconductor manufacturing apparatus of this invention using the degassing mechanism includes an exposing section for irradiating, with exposing light through a mask, a resist film formed on a substrate that is placed on a stage and on which the resist film is formed, with a liquid provided on the resist film; a liquid supplying section for supplying the liquid between the resist film and the exposing section; a liquid recovering section for recovering the liquid having been supplied onto the resist film; and a controlling section for controlling a liquid supplying operation of the liquid supplying section, a liquid recovering operation of the liquid recovering section and an operation of the stage.

In the third semiconductor manufacturing apparatus, the controlling section appropriately adjusts a flow rate and a flowing direction of the liquid caused on the stage and a movement rate and a moving direction of the stage. Therefore, the air can be prevented from being swallowed up into the liquid through the edge of the substrate in moving the stage, and hence, no foams are formed. As a result, a fine pattern can be formed in a good shape.

In the third semiconductor manufacturing apparatus, the controlling section preferably controls the liquid supplying operation and the liquid recovering operation and adjusts the operation of the stage in such a manner that a flow rate and a flowing direction of the liquid caused on the resist film by the liquid supplying operation and the liquid recovering operation substantially accord with a movement rate and a moving direction of the stage.

In the first semiconductor manufacturing apparatus, the liquid recovered through the recovering path to the removing part is preferably degassed in the removing part and supplied onto the resist film through the supplying path.

In the third semiconductor manufacturing apparatus, the liquid recovering section and the liquid supplying section are preferably mutually connected, and the liquid having been recovered by the liquid recovering section preferably flows into the liquid supplying section. Thus, the cost of the liquid can be reduced and the liquid can be stably supplied.

The first pattern formation method of this invention using a degassing mechanism includes the steps of forming a resist film on a substrate; performing pattern exposure by selectively irradiating the resist film with exposing light with a liquid provided on the resist film; and forming a resist pattern by developing the resist film after the pattern exposure, and the step of performing pattern exposure includes a sub-step of removing a gas included in the liquid provided on the resist film.

In the first pattern formation method, the liquid provided on the resist film is always degassed, and hence, no foams are formed in the liquid used in the exposure. As a result, a fine pattern can be formed in a good shape.

The second pattern formation method of this invention using a degassing mechanism includes the steps of forming a resist film on a substrate; performing pattern exposure by selectively irradiating the resist film with exposing light with a liquid provided on the resist film after placing, on a stage, the substrate on which the resist film is formed; and forming a resist pattern by developing the resist film after the pattern exposure, and the step of performing pattern exposure includes a sub-step of supplying the liquid onto the resist film and recovering the liquid from above the resist film in such a manner that a flow rate and a flowing direction of the liquid caused on the resist film substantially accord with a movement rate and a moving direction of the stage.

In the second pattern formation method, in the step of performing pattern exposure, the air can be prevented from being swallowed up into the liquid provided on the stage through the edge of the substrate in moving the stage, and hence, no foams are formed. As a result, a fine pattern can be formed in a good shape.

The first or second pattern formation method preferably further includes, after the step of performing pattern exposure, a step of recovering the liquid for recycle.

(Aspects Using Mechanism for Supplying Immersion Liquid Through Spray)

The present inventors have found that foams formed in an immersion liquid are remarkably reduced by spraying the liquid to be stored and that spraying the immersion liquid on a foam itself reduces the diameter of the foam and increases the flow rate, so as to improve foam breaking power.

Specifically, when a liquid is sprayed, the diameter of each liquid drop is very small and the flow rate of the liquid drop is higher as compared with a general case where the liquid is allowed to flow into a vessel. Accordingly, for example, when a liquid is supplied through spray on a liquid previously stored in a vessel, the force of the sprayed liquid colliding against the liquid face of the previously stored liquid is larger than that obtained in the case where the liquid is allowed to flow into the vessel. At this point, since drops of the sprayed liquid have very small diameters, the spayed liquid is rapidly permeated in the liquid surface of the stored liquid because the repulsion of the liquid surface is small. In other words, when a liquid is sprayed, foams are minimally formed, and in the case where the sprayed liquid collides against a previously formed foam, the foam is easily vanished.

The following aspects of the present invention were devised on the basis of the aforementioned finding. In the case where an immersion liquid is temporalily stored, the immersion liquid is sprayed to be stored, so as to vanish foams formed in the liquid to be provided between a resist film and a projection lens. These aspects are specifically practiced as follows:

The fourth semiconductor manufacturing apparatus of this invention includes a stage for placing a substrate on which a resist film is formed; a liquid supplying section for supplying a liquid onto the stage; and an exposing section for irradiating the resist film with exposing light through a mask with the liquid provided on the resist film, and the liquid supplying section includes a storing part for storing the liquid and a spraying nozzle for spraying the liquid into the storing part.

In the fourth semiconductor manufacturing apparatus, foams formed in the immersion liquid to be provided between the exposing section and the resist film can be vanished. Accordingly, the abnormality of aberration of the projection lens can be prevented, resulting in forming a resist pattern in a good shape.

In the fourth semiconductor manufacturing apparatus, the liquid supplying section preferably includes a nozzle for allowing another liquid to flow into the storing part. Thus, when another liquid is allowed to flow into a vessel to be stored through the nozzle and the liquid is sprayed on the stored liquid through the spraying nozzle, the sprayed liquid is mixed with the stored liquid while vanishing foams formed in the stored liquid. Furthermore, since the sprayed liquid can be added to the stored liquid little by little, the composition of the mixed liquid can be easily adjusted. However, the sprayed liquid and the stored liquid need not have different compositions but may have the same composition.

In this case, the nozzle for allowing another liquid to flow is preferably a spray nozzle.

In the fourth semiconductor manufacturing apparatus, the exposing section and the liquid supplying section are preferably disposed within one chamber.

Alternatively, in the fourth semiconductor manufacturing apparatus, it is preferred that the exposing section is disposed within a chamber and that the liquid supplying section is disposed outside the chamber. Thus, the inside of the chamber can be prevented from being contaminated by the liquid stored in the storing part.

The third pattern formation method of this invention includes the steps of forming a resist film on a substrate; spraying a liquid to be stored; performing pattern exposure by selectively irradiating the resist film with exposing light with the stored liquid provided on the resist film; and forming a resist pattern by developing the resist film after the pattern exposure.

In the third pattern formation method, the liquid is sprayed to be stored and the stored liquid is provided on the resist film, and hence, foams formed in the liquid can be vanished. Accordingly, the abnormality of aberration of a projection lens can be prevented, resulting in forming a resist pattern in a good shape.

In the third pattern formation method, in the step of spraying a liquid, the liquid is stored by spraying the liquid on another liquid previously stored. Thus, since the sprayed liquid is added to the previously stored liquid, the sprayed liquid is mixed with the stored liquid while vanishing foams formed in the stored liquid. Furthermore, since the sprayed liquid can be added to the stored liquid little by little, the composition of the mixed liquid can be easily adjusted. However, the sprayed liquid and the stored liquid need not have different compositions but may have the same composition.

In the third pattern formation method, the step of spraying a liquid and the step of performing pattern exposure are preferably executed in parallel.

In any of the semiconductor manufacturing apparatuses and the pattern formation methods of the invention, when the exposing light is UV such as g-line or i-line, or far UV such as KrF excimer laser or ArF excimer laser, the liquid is preferably water.

Alternatively, in any of the semiconductor manufacturing apparatuses and the pattern formation methods of the invention, when the exposing light is vacuum UV such as $F_2$ laser, the liquid is preferably perfluoropolyether.

In any of the semiconductor manufacturing apparatuses and the pattern formation methods of the invention, the immersion liquid preferably includes an antifoaming agent. Thus, foams formed in the liquid can be largely removed by the antifoaming agent, and hence, pattern failure derived from the influence of the foams occurring in the exposure can be largely reduced.

As the antifoaming agent, a foam breaker, a foam inhibitor or a defoaming agent may be used. A foam breaker is adsorbed onto a foam and enters the surface film of the foam through the function of surface tension. Thereafter, the foam breaker expands over the surface film of the foam through the surface tension, and this reduces the thickness of the surface film, so that the surface film can be ultimately broken. A foam inhibitor is adsorbed onto the surface film of a foam together with a foaming substance in a liquid. When the foam inhibitor is adsorbed, the surface tension of the surface film of the foam is lowered, so as to reduce the thickness of the surface film. Therefore, the foam becomes unstable and breaks when it reaches the liquid surface. A defoaming agent is adsorbed onto the surface film of a foam in a liquid. When such foams are adsorbed to one another in the liquid, the foams are broken on the adsorbed interfaces, and hence, the foams are combined to form a large foam. The large foam has a large ascending force and hence ascends to the liquid surface at a high speed.

As described so far, in the semiconductor manufacturing apparatus and the pattern formation method using the same according to this invention, no foams are formed in a liquid provided on a resist film, and hence, the abnormality of the aberration of a projection lens and exposure abnormality such as focus failure can be prevented. As a result, a resist pattern can be formed in a good shape.

DETAILED DESCRIPTION OF THE INVENTION

Embodiment 1

Figure 1:
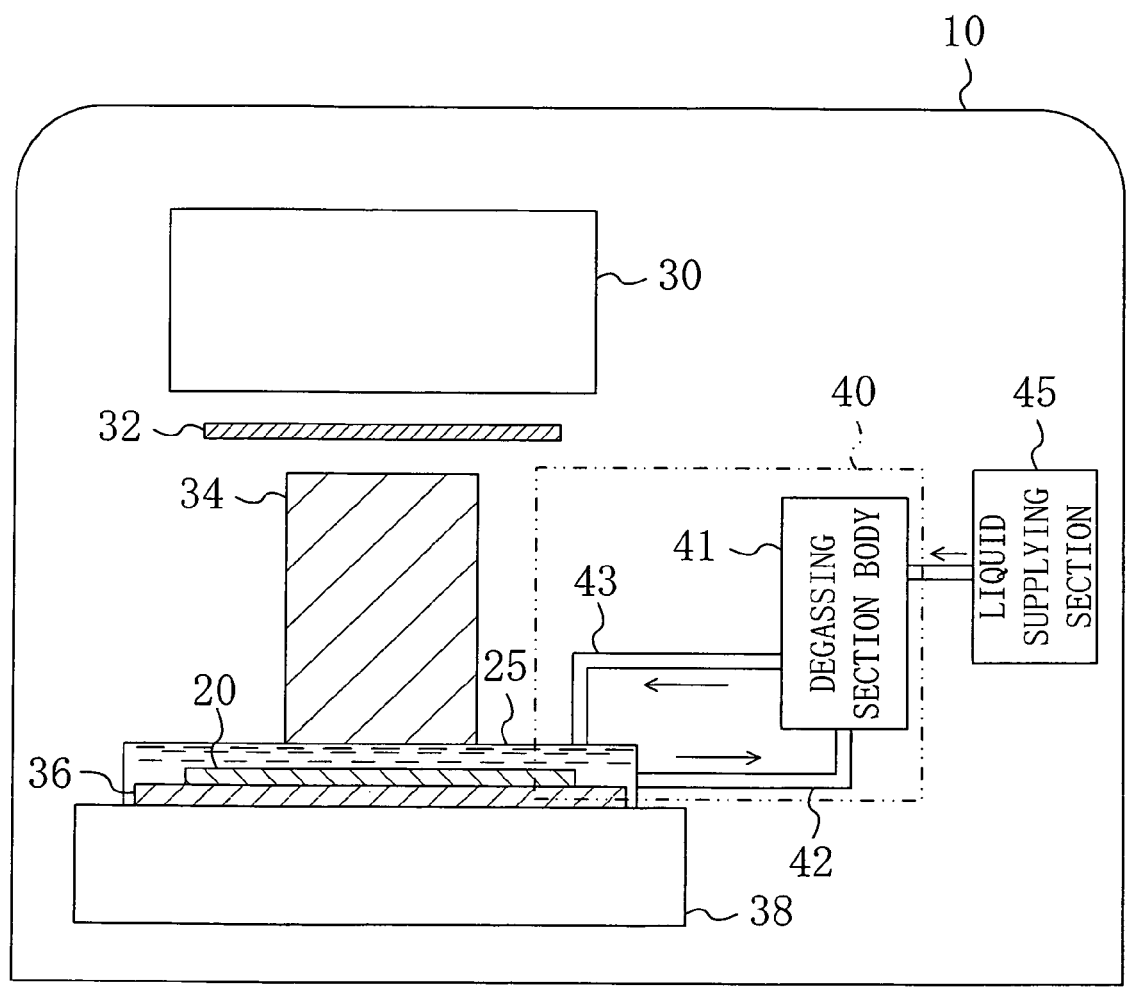
FIG. 1 is a schematic cross-sectional view of a principal part of a semiconductor manufacturing apparatus used for realizing a pattern formation method employing immersion lithography according to Embodiment 1 of the invention.

FIG. 1 schematically shows the cross-sectional structure of a principal part of a semiconductor manufacturing apparatus used for realizing a pattern formation method employing immersion lithography according to Embodiment 1 of the invention.

As shown in FIG. 1, the semiconductor manufacturing apparatus of Embodiment 1 includes an optical system 30 that is provided within a chamber 10 and works as a light source for exposing a design pattern onto a resist film (not shown) applied on a principal surface of a wafer 20; a degassing section 40 for degassing (defoaming) a liquid 25 provided on the resist film of the wafer 20 in the exposure for increasing the value of the numerical aperture of exposing light; and a liquid supplying section 45 for supplying the liquid 25 to the degassing section 40.

Below the optical system 30, an exposing section (projection lens) 34 for projecting, through the liquid 25 onto the resist film, the exposing light emitted from the optical system 30 and entering through a mask (reticle) 32 having a design pattern to be transferred onto the resist film and a movable stage 36 for holding the wafer 20 are disposed. The exposing section 34 is held to be in contact with the surface of the liquid 25 provided on the resist film of the wafer 20 so as to cover the movable stage 36 (or the wafer 20) in the exposure. Also, the movable stage 36 is held on a surface plate 38 movably against the exposing section 34.

The degassing section 40 includes a degassing section body 41 for degassing the liquid 25; a recovering path 42 for recovering the liquid 25 having been provided onto the movable stage 36 to the degassing section body 41; and a supplying path 43 for supplying the liquid 25 having been degassed onto the movable stage 36.

The liquid 25 having been recovered to and degassed by the degassing section body 41 is supplied onto the movable stage 36 again so as to be used in next exposure. At this point, the degassing section body 41 may not recover the whole liquid 25 having been supplied onto the movable stage 36 but may mix a part of the recovered liquid 25 with a fresh liquid 25 newly supplied from the liquid supplying section 45, degas the mixed liquid 25 in the degassing section body 41 and provide the degassed liquid 25 onto the movable stage 36 again.

The degassing section body 41 may employ any of a nitrogen dissolving method, a gas-liquid separating film method using a film of amorphous fluoropolymer or the like with a filter mesh size of, for example, approximately 0.1 μm, a thermal degassing method, a vacuum degassing method, a nitrogen gas bubbling method, a film degassing method, a reducer adding method, a reducing method using a catalytic resin and other known techniques.

Now, the pattern formation method using the semiconductor manufacturing apparatus of FIG. 1 will be described with reference to FIGS. 2A through 2D.

First, a positive chemically amplified resist material having the following composition is prepared:

| | | |
|---|---|---|
| Base polymer: | poly((norbornene-5-methylene-t-butylcarboxylate) (50 mol %) – (maleic anhydride) (50 mol %)) | 2 g |
| Acid generator: | triphenylsulfonium triflate | 0.06 g |
| Quencher: | triethanolamine amine | 0.002 g |
| Solvent: | propylene glycol monomethyl ether acetate | 20 g |

Figure 2A:
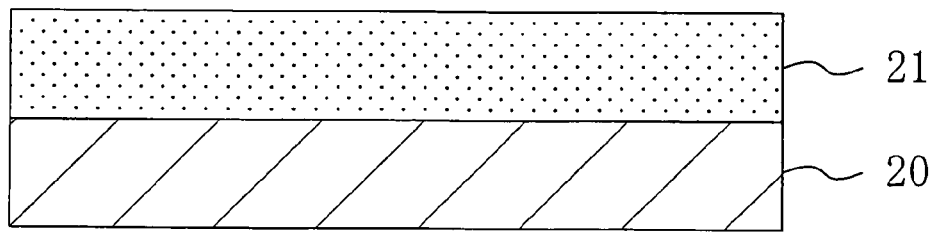
FIGS. 2A, 2B, 2C and 2D are cross-sectional views for showing procedures in the pattern formation method using the semiconductor manufacturing apparatus of Embodiment 1 of the invention.

Next, as shown in FIG. 2A, the aforementioned chemically amplified resist material is applied on a substrate 20 so as to form a resist film 21 with a thickness of 0.35 μm.

Figure 2B:
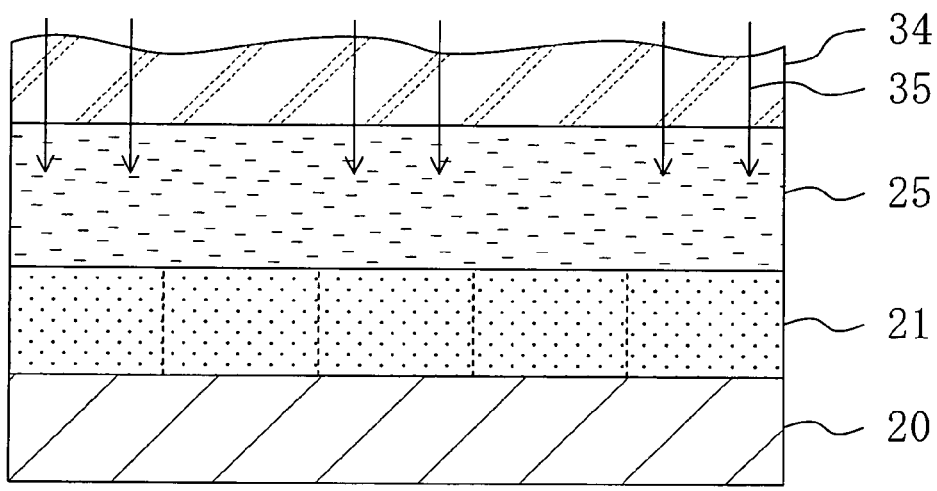

Then, as shown in FIG. 2B, with a liquid 25 of water provided between the resist film 21 and the projection lens 34, pattern exposure is carried out by irradiating the resist film 21 with exposing light 35 of ArF excimer laser with NA of 0.65 through a mask (not shown). At this point, as shown in FIG. 1, the liquid 25 is degassed in the degassing section body 41 through the recovering path 42 of the degassing section 40 during the exposure when it is supplied onto the resist film 21 and the resultant degassed liquid 25 is restored onto the movable stage 36 through the supplying path 43.

Figure 2C:
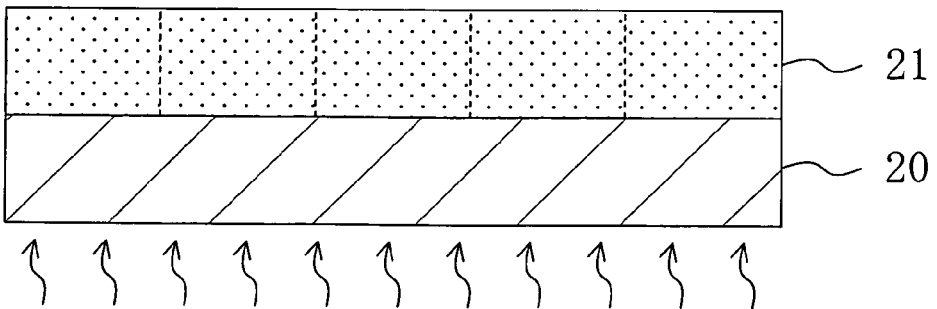
Figure 2D:
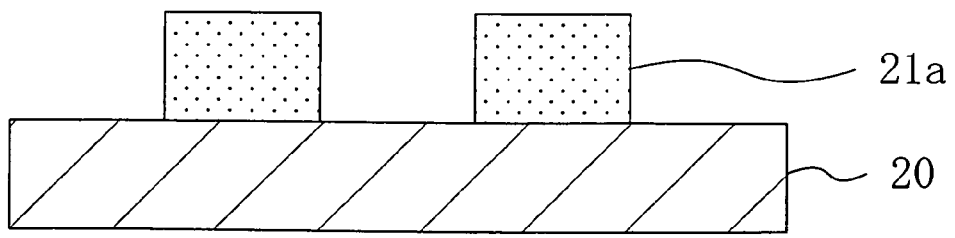

After the pattern exposure, as shown in FIG. 2C, the resist film 21 is baked with a hot plate at a temperature of 100° C. for 60 seconds, and the resultant resist film is developed with a 2.38 wt % tetramethylammonium hydroxide developer. In this manner, a resist pattern 21*a* made of an unexposed portion of the resist film 2 and having a line width of 0.09 μm is formed as shown in FIG. 2D.

In this manner, according to the pattern formation method of Embodiment 1, the liquid 25 provided on the resist film 21 is degassed (defoamed) during the pattern exposure. Therefore, even when foams are formed within the liquid 25 due to the movement of the movable stage 36, the formed foams are removed. As a result, it is possible to prevent abnormality of the aberration and the diffraction of the exposing light 35 that are otherwise caused by the foams when the exposing light passes through the liquid 25. Accordingly, exposure abnormality such as focus failure is prevented, so that the resist pattern 21*a* made of the resist film 21 can be formed in a good shape.

The present inventors have confirmed through measurement with laser scanning of the liquid 25 that the diffraction of light is not affected if 100 ml of the liquid 25 includes approximately 30 or less foams with a diameter of approximately 0.1 μm or more. Accordingly, in the exposure shown in FIG. 2B, the liquid 25 may be always degassed or appropriately degassed so as to satisfy this condition.

Modification of Embodiment 1

Now, a modification of Embodiment 1 will be described with reference to the accompanying drawing.

Figure 3:
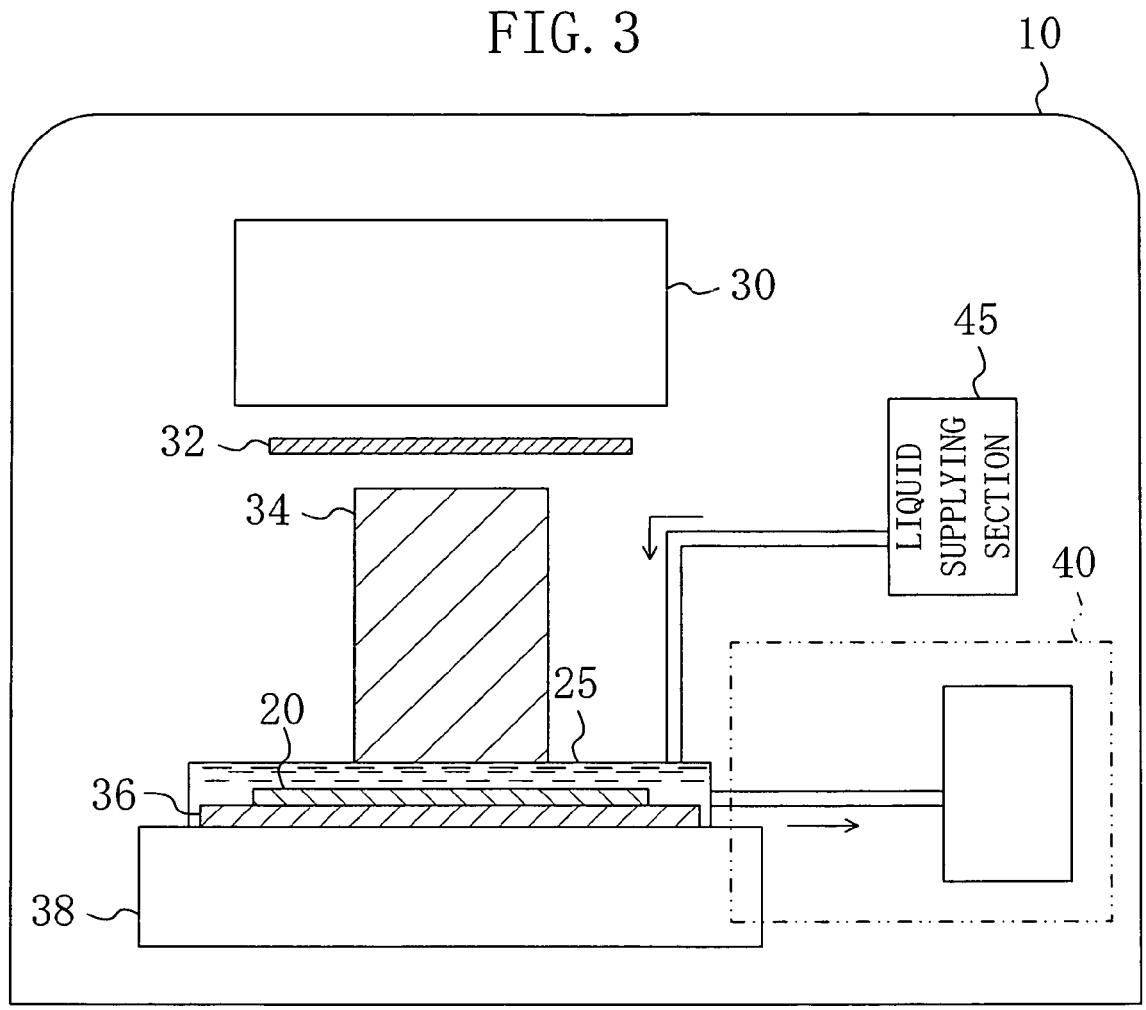
FIG. 3 is a schematic cross-sectional view of a principal part of a semiconductor manufacturing apparatus according to a modification of Embodiment 1.

FIG. 3 schematically shows the cross-sectional structure of a principal part of a semiconductor manufacturing apparatus used for realizing a pattern formation method employing the immersion lithography according to the modification of Embodiment 1. In FIG. 3, like reference numerals are used to refer to like elements shown in FIG. 1 so as to omit the description.

As shown in FIG. 3, in the semiconductor manufacturing apparatus of this modification, a liquid 25 provided onto a wafer 20 is directly supplied from a liquid supplying section 45, and the liquid 25 having been provided onto the wafer 20 is degassed by a degassing section 40 during exposure. The liquid 25 supplied from the liquid supplying section 45 may or may not be previously degassed. Moreover, there is no need to always perform the degassing process but it may be appropriately performed when, for example, foams are formed within the liquid 25.

Alternatively, the liquid 25 having been used in the exposure may be recovered to the degassing section 40 and degassed therein, so that the degassed liquid 25 may be supplied onto the wafer 20 again thereafter.

In this manner, according to this modification, the liquid 25 provided onto the resist film is always or appropriately degassed (defoamed) in the pattern exposure. Therefore, even when foams are formed in the liquid 25 due to the movement of the movable stage 36, the formed foams are removed. As a result, it is possible to prevent the abnormality of the aberration and the diffraction of the exposing light that are otherwise caused by the foams when the exposing light passes through the liquid 25. Accordingly, the exposure abnormality such as focus failure is prevented, so that the resist pattern made of the resist film can be formed in a good shape.

Embodiment 2

Figure 4:
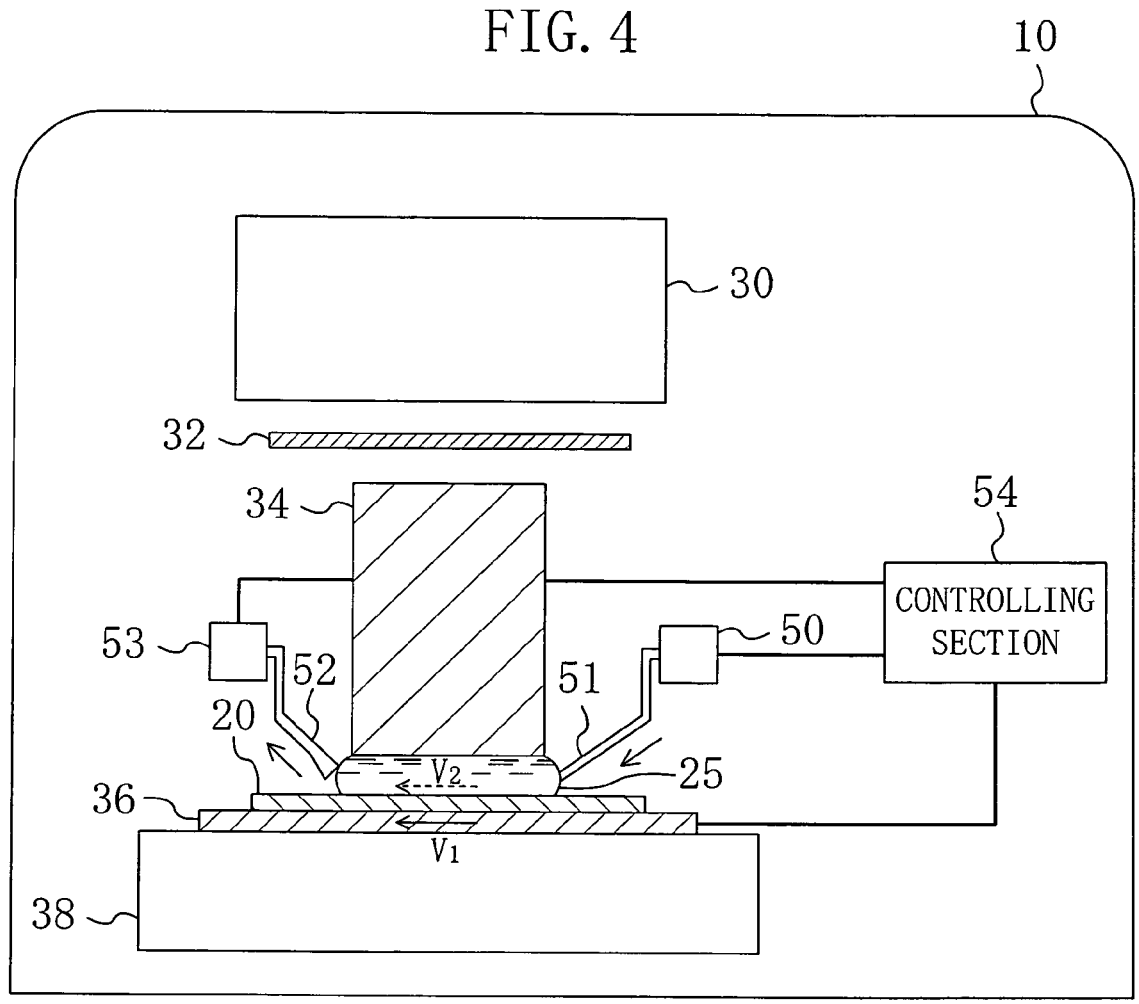
FIG. 4 is a schematic cross-sectional view of a principal part of a semiconductor manufacturing apparatus used for realizing a pattern formation method employing the immersion lithography according to Embodiment 2 of the invention.

FIG. 4 schematically shows the cross-sectional structure of a principal part of a semiconductor manufacturing apparatus used for realizing a pattern formation method employing the immersion lithography according to Embodiment 2 of the invention. In FIG. 4, like reference numerals are used to refer to like elements shown in FIG. 1 so as to omit the description.

As shown in FIG. 4, in the semiconductor manufacturing apparatus of Embodiment 2, a liquid used for increasing the value of the numerical aperture of exposing light is partially provided onto the principal surface of a wafer 20, namely, provided in the form of drops, instead of employing the pooling method of Embodiment 1 and the modification in which the whole wafer 20 is immersed in the liquid.

In the dropping method of this embodiment, the liquid 25 in the form of drops is allowed to flow during the movement of the movable stage 36 at a flow rate for preventing the air from being swallowed up into the liquid 25. Specifically, the movement rate V1 of the movable stage 36 against the surface plate 38 is set to be substantially equal to the flow rate V2 against the surface plate 38 of the liquid 25 provided between the wafer 20 (the resist film) and the exposing section 34. Thus, the relative rate between the wafer 20 and the liquid 25 is substantially zero, and therefore, the air can be prevented from being swallowed up into the liquid 25 through the edge of the wafer 20.

Specifically, the semiconductor manufacturing apparatus includes a liquid supplying section 50 for providing the liquid 25 previously having been degassed onto the wafer 20 through a supplying nozzle 51; a liquid recovering unit 53 for recovering the liquid 25 having been provided on the wafer 20 through a recovering nozzle 52; and a controlling section 54 for controlling the operations of the liquid supplying section 50, the liquid recovering unit 53 and the movable stage 36.

The controlling section 54 controls the liquid supplying section 50 and the liquid recovering unit 53 so as to synchronize the flow rate V2 and the flowing direction of the liquid 25 caused on the wafer 20 with the movement rate V1 and the moving direction of the movable stage 36. For example, with supplying nozzles and recovering nozzles additionally provided apart from the supplying nozzle 51 and the recovering nozzle 52, when the moving direction of the movable stage 36 is changed, the controlling section 54 may select any of the plural supplying nozzles and the plural recovering nozzles so as to make the liquid 25 flow along a direction according to the changed moving direction of the resist film.

In this manner, since the movement rate V1 and the moving direction of the movable stage 36 substantially accord with the flow rate V2 and the flowing direction of the liquid 25 provided on the wafer 20 in Embodiment 2, the air can be prevented from being swallowed up into the liquid 25 through the interface between the liquid 25 and the resist film.

Specifically, the present inventors have confirmed the following: In the case where the movement rate V1 of the movable stage 36 is, for example, 100 mm/s through 1000 mm/s, if a difference between the flow rate V2 of the liquid and the movement rate V1 is ±10% or less, the number of foams with a diameter of 0.1 μm or more included in 100 ml of the liquid is approximately 30 or less.

Now, the pattern formation method using the semiconductor manufacturing apparatus of FIG. 4 will be described with reference to FIGS. 5A through 5D.

First, a positive chemically amplified resist material having the following composition is prepared:

| Base polymer: | poly((norbornene-5-methylene-t-butylcarboxylate) (50 mol %) – (maleic anhydride) (50 mol %)) | 2 g |
|---|---|---|
| Acid generator: | triphenylsulfonium triflate | 0.06 g |
| Quencher: | triethanolamine amine | 0.002 g |
| Solvent: | propylene glycol monomethyl ether acetate | 20 g |

Figure 5A:
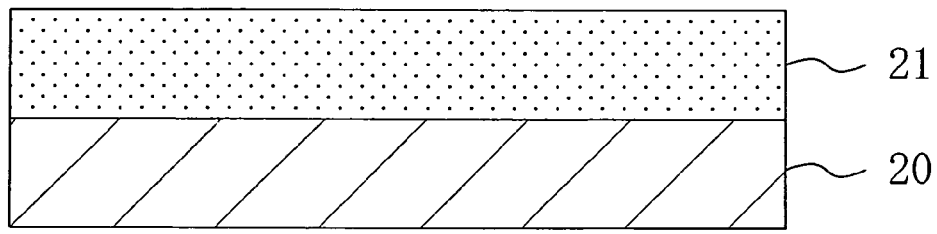
FIGS. 5A, 5B, 5C and 5D are cross-sectional views for showing procedures in the pattern formation method using the semiconductor manufacturing apparatus of Embodiment 2.

Next, as shown in FIG. 5A, the aforementioned chemically amplified resist material is applied on a substrate 20 so as to form a resist film 21 with a thickness of 0.35 μm.

Figure 5B:
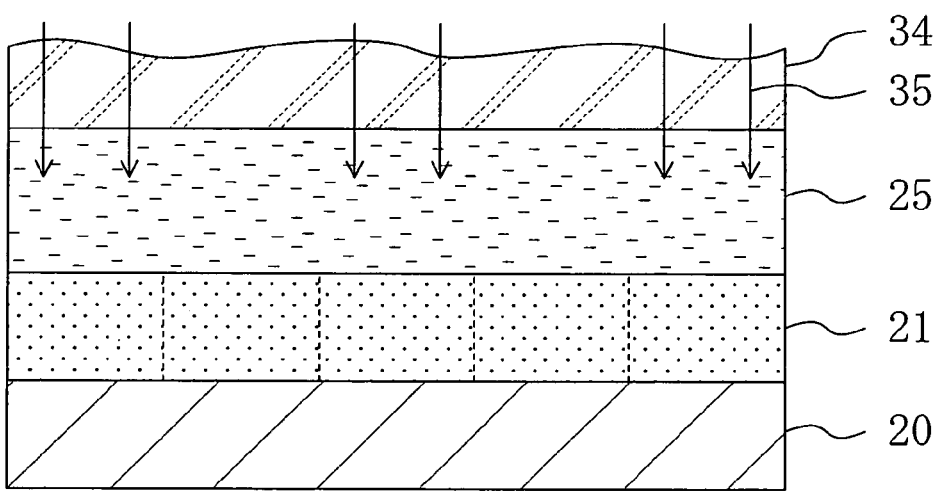

Then, as shown in FIG. 5B, a liquid 25 of water is supplied to and recovered from a portion between the resist film 21 and the projection lens 34 at a flow rate V2 synchronized with the movement rate V1 of the movable stage 36 with a rate difference of ±10% or less. Under these conditions, pattern exposure is carried out by irradiating the resist film 21 with exposing light 35 of ArF excimer laser with NA of 0.65 through a mask (not shown). At this point, as shown in FIG. 4, the liquid 25 is always or appropriately degassed in the degassing section 40 also during the exposure when it is supplied onto the resist film 21.

Figure 5C:
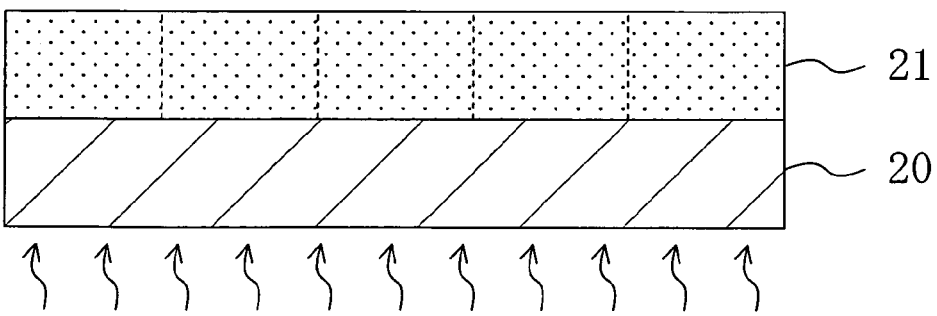
Figure 5D:
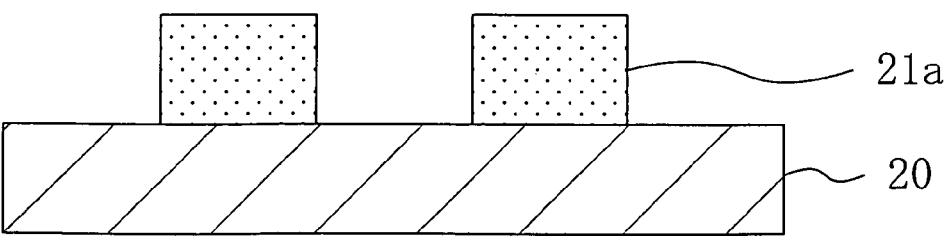

After the pattern exposure, as shown in FIG. 5C, the resist film 21 is baked with a hot plate at a temperature of 100° C. for 60 seconds, and the resultant resist film is developed with a 2.38 wt % tetramethylammonium hydroxide developer. In this manner, a resist pattern 21a made of an unexposed portion of the resist film 21 and having a line width of 0.09 μm is formed as shown in FIG. 5D.

Alternatively, the liquid 25 having been recovered by the liquid recovering unit 53 is transferred (circulated) to the liquid supplying section 50 so as to be supplied onto the wafer 20 again. Thus, the immersion liquid 25 can be repeatedly recycled, resulting in effectively reducing the cost and an exhausted substance.

In this manner, in the pattern formation method of Embodiment 2, the flow rate V2 of the liquid 25 having been previously degassed and provided on the resist film 21 is made to substantially synchronize with the movement rate V1 of the movable stage (with a rate difference of, for example, ±10% or less) in the pattern exposure, and therefore, even when the movable stage 36 is moved, foams are not formed within the liquid 25. As a result, since the abnormality of the aberration and the diffraction of exposing light 35 otherwise caused by foams when the exposing light passes through the liquid 25 can be prevented, exposure abnormality such as focus failure is prevented, so that the resist pattern 21a made of the resist film 21 can be formed in a good shape.

Although water is used as the liquid 25 used for increasing the value of the numerical aperture of the exposing light in Embodiment 1, the modification of Embodiment 1 and Embodiment 2, perfluoropolyether may be used instead of water.

Also, although the ArF excimer laser is used as the exposing light, KrF excimer laser, $F_2$ laser, $Kr_2$ laser, ArKr laser, $Ar_2$ laser or $Xe_2$ laser may be used instead.

Embodiment 3

Figure 6:
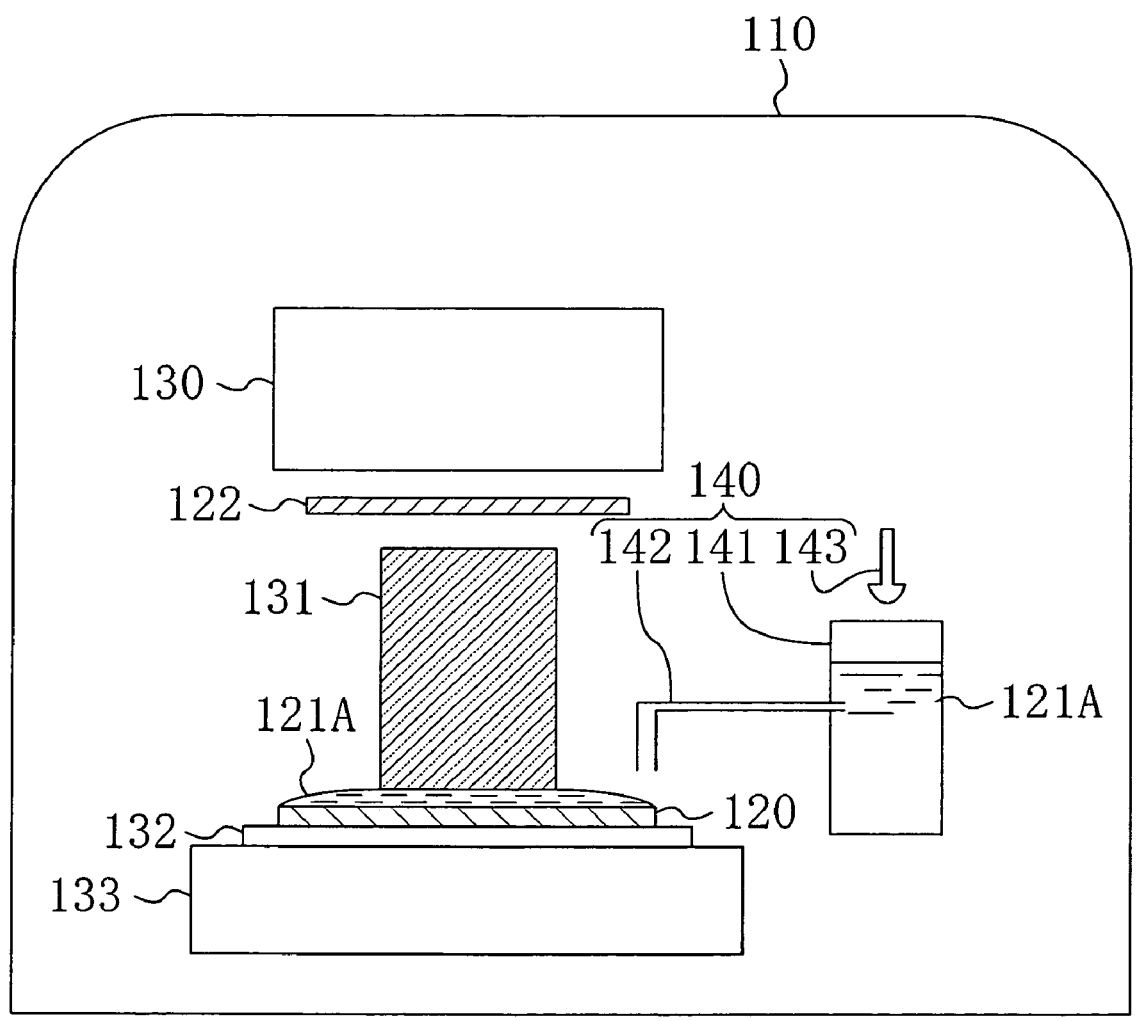
FIG. 6 is a schematic cross-sectional view of a principal part of a semiconductor manufacturing apparatus used for realizing a pattern formation method employing the immersion lithography according to Embodiment 3 of the invention.

FIG. 6 schematically shows the cross-sectional structure of a principal part of an exposure system, that is, a semiconductor manufacturing apparatus, used for realizing a pattern formation method employing the immersion lithography according to Embodiment 3 of the invention.

As shown in FIG. 6, the exposure system of Embodiment 3 includes an illumination optical system 130 provided within a chamber 110 and working as a light source for exposing a design pattern onto a resist film (not shown) applied on a wafer 120; and a liquid supplying section 140 for supplying, onto the resist film of the wafer 120, an immersion liquid 121A used for increasing the value of the numerical aperture of exposing light in the exposure.

Below the illumination optical system 130, a projection lens 131 for projecting, onto the resist film through the liquid 121A, the exposing light emitted from the illumination optical system 130 and entering through a mask (reticle) 122 having a design pattern to be transferred onto the resist film; a wafer stage 132 for holding the wafer 120; and a surface plate 133 for holding the wafer stage 132 are disposed. The projection lens 131 is held to be in contact with the surface of the liquid 121A supplied onto the resist film of the wafer 120 during the exposure.

The liquid supplying section 140 includes a vessel 141 for temporarily storing the liquid 121A, a supplying nozzle 142 for supplying the stored liquid 121A onto the wafer 120, and a storing spray nozzle 143 for spraying fresh liquid 121A to be stored in the vessel 141.

In Embodiment 3, the liquid supplying section 140 stores the liquid 121A sprayed into the vessel 141, and thereafter, the stored liquid 121A is supplied onto the wafer 120 through the supplying nozzle 142.

According to Embodiment 3, since the liquid supplying section 140 includes the storing spray nozzle 143 for spraying the liquid 121A into the vessel 141 to be stored, foams formed within the liquid 121A to be provided between the resist film and the projection lens 131 can be vanished within the vessel 141. As a result, the abnormality of aberration and defocusing of the projection lens 131 can be prevented, so as to form a resist pattern made of a resist film in a good shape.

Modification 1 of Embodiment 3

Figure 7:
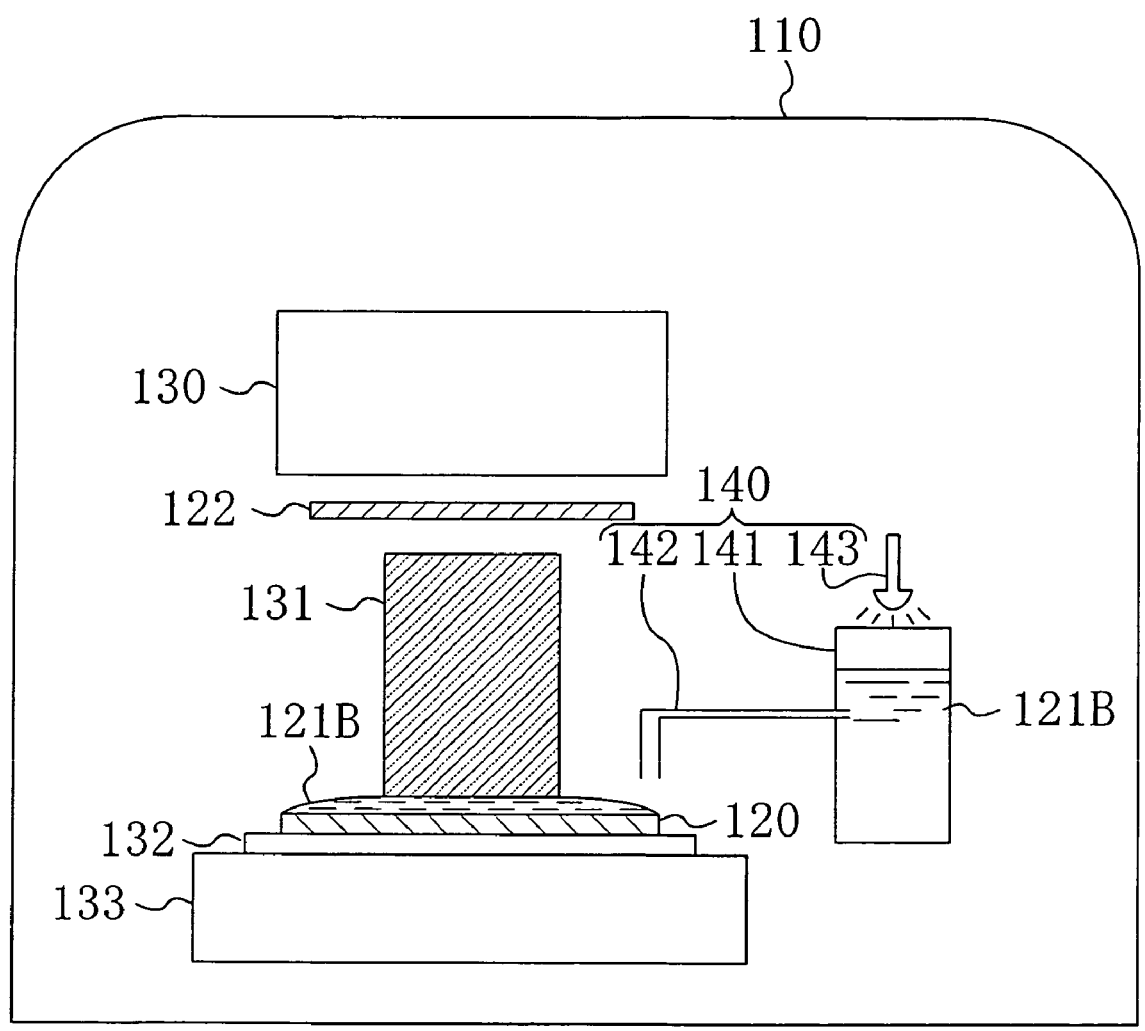
FIG. 7 is a schematic cross-sectional view of a principal part of a semiconductor manufacturing apparatus according to Modification 1 of Embodiment 3.

FIG. 7 schematically shows the cross-sectional structure of a principal part of an exposure system according to Modification 1 of Embodiment 3. In FIG. 7, like reference numerals are used to refer to like elements shown in FIG. 6 so as to omit the description.

As shown in FIG. 7, in the exposure system of Modification 1, a liquid 121B stored in the liquid supplying section 140 is supplied onto the wafer 120 through the supplying nozzle 142, and at the same time, a fresh liquid 121B is sprayed into the vessel 141 to be stored. Also in this manner, foams formed in the liquid 121B to be provided between the resist film and the projection lens 131 can be vanished within the vessel 141, and hence, the abnormality of aberration and defocusing of the projection lens 131 can be prevented.

Modification 2 of Embodiment 3

Figure 8:
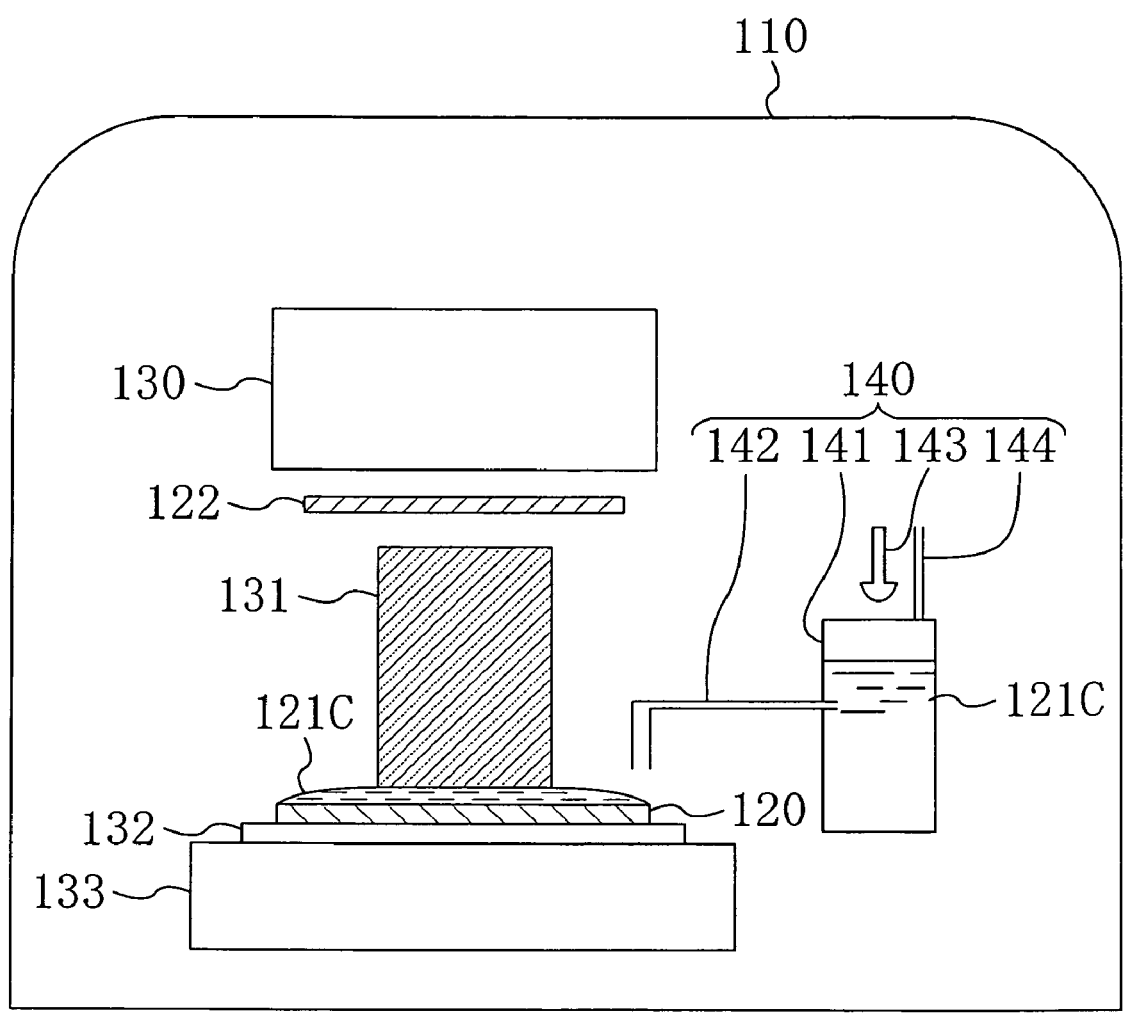
FIG. 8 is a schematic cross-sectional view of a principal part of a semiconductor manufacturing apparatus according to Modification 2 of Embodiment 3.

FIG. 8 schematically shows the cross-sectional structure of a principal part of an exposure system according to Modification 2 of Embodiment 3. In FIG. 8, like reference numerals are used to refer to like elements shown in FIG. 6 so as to omit the description.

As shown in FIG. 8, in the exposure system of Modification 2, the liquid supplying section 140 is provided with, in addition to the storing spray nozzle 143, a storing nozzle 144 for allowing another liquid to flow into the vessel 141.

In Modification 2, a first liquid is first stored in the vessel 141 through the storing nozzle 144, and then, a second liquid is sprayed through the storing spray nozzle 143 to be mixed with the first liquid. As described above, when the second liquid is sprayed into the first liquid previously stored, since drops of the sprayed second liquid have very small diameters, the second liquid is rapidly permeated in the liquid surface of the first liquid because the repulsion of the liquid surface is small. As a result, few foams are formed in the sprayed second liquid, and in addition, when the sprayed liquid collides against a foam, the foam is easily vanished. Accordingly, even when a liquid 121C is mixed in the vessel 141, foams otherwise formed in the liquid 121C to be provided between the resist film and the projection lens 131 can be vanished within the vessel 141, and therefore, the abnormality of aberration and defocusing of the projection lens 131 can be prevented.

It is noted that the first liquid and the second liquid may have the same composition. Furthermore, the storing nozzle 144 for introducing the first liquid into the vessel 141 may be a spray nozzle capable of spraying the first liquid.

Also, with respect to the timing of mixing the first liquid and the second liquid, the mixture may be completed before supplying the liquid 121C onto the wafer 120 or these liquids may be mixed while supplying the liquid 121C onto the wafer 120.

Modification 3 of Embodiment 3

Figure 9:
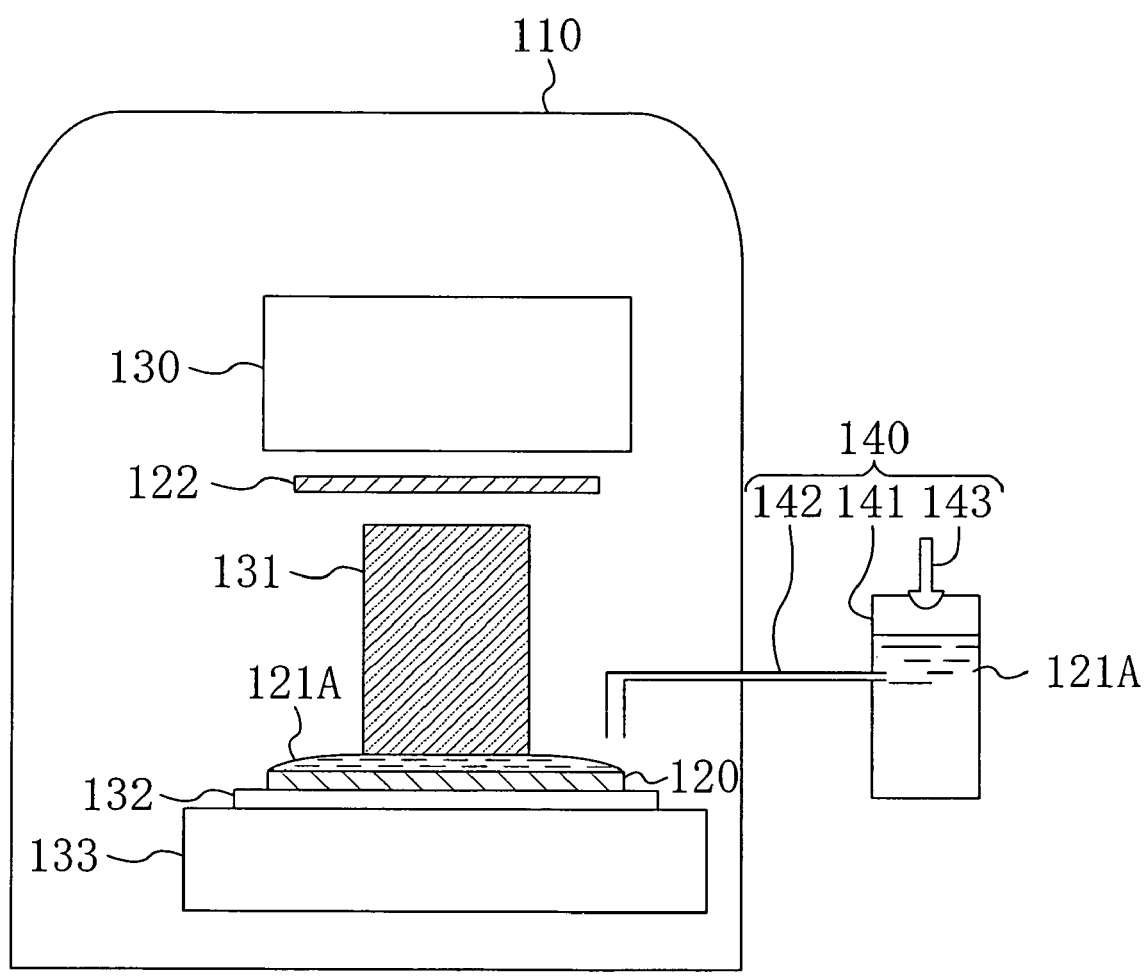
FIG. 9 is a schematic cross-sectional view of a principal part of a semiconductor manufacturing apparatus according to Modification 3 of Embodiment 3.

FIG. 9 schematically shows the cross-sectional structure of a principal part of an exposure system according to Modification 3 of Embodiment 3. In FIG. 9, like reference numerals are used to refer to like elements shown in FIG. 6 so as to omit the description.

As shown in FIG. 9, in the exposure system of Modification 3, the liquid supplying section 140 is provided outside the chamber 110. Thus, in spraying the liquid 121A into the vessel 141 to be stored, it is possible to prevent the inside of the chamber 110 from being contaminated by the liquid 121A scattered out of the vessel 141. As a result, the cleanness of the exposure environment can be highly kept.

Embodiment 4

Now, a pattern formation method using the exposure system according to Embodiment 3 shown in FIG. 6 or Modification 3 shown in FIG. 9 will be described as Embodiment 4 with reference to FIGS. 10A through 10D.

First, a positive chemically amplified resist material having the following composition is prepared:

| | | |
|---|---|---|
| Base polymer: | poly((norbornene-5-methylene-t-butylcarboxylate) (50 mol %) – (maleic anhydride) (50 mol %)) | 2 g |
| Acid generator: | triphenylsulfonium triflate | 0.06 g |
| Solvent: | propylene glycol monomethyl ether acetate | 20 g |

Figure 10A:
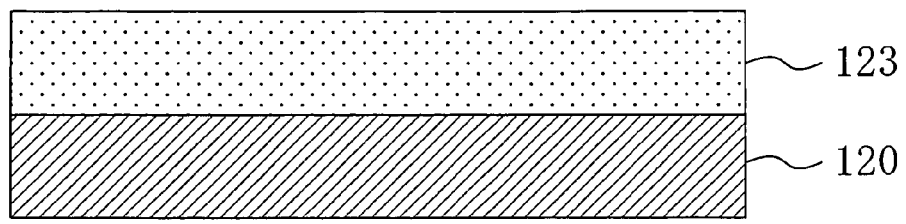
FIGS. 10A, 10B, 10C and 10D are cross-sectional views for showing procedures in a pattern formation method according to Embodiment 4 of the invention.

Next, as shown in FIG. 10A, the aforementioned chemically amplified resist material is applied on a substrate 120 so as to form a resist film 123 with a thickness of 0.35 μm.

Figure 10B:
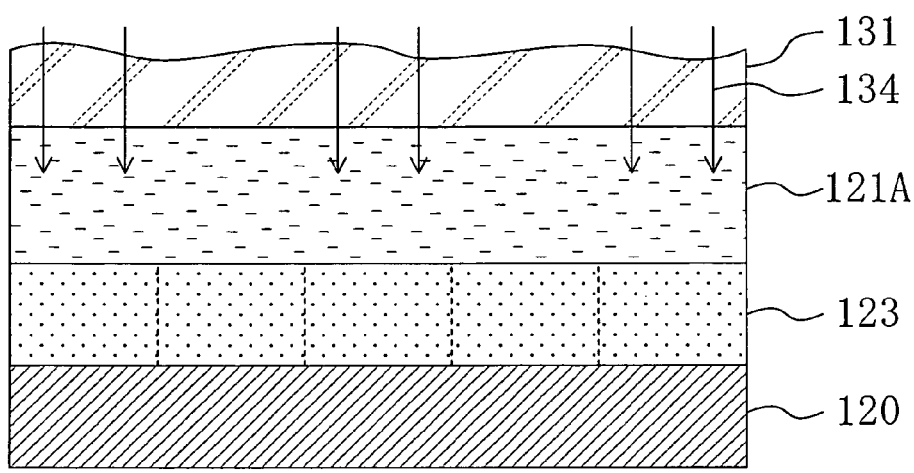

Then, as shown in FIG. 10B, with a liquid 121A of water provided between the resist film 123 and the projection lens 131, pattern exposure is carried out by irradiating the resist film 123 with exposing light 134 of ArF excimer laser with NA of 0.65 through a mask. At this point, as shown in FIG. 6 or 9, the liquid 121A having been defoamed is supplied from the liquid supplying section 140 that temporalily stores the liquid 121A.

Figure 10C:
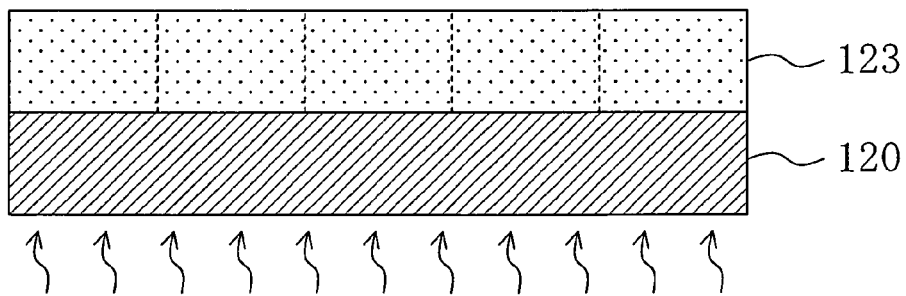
Figure 10D:
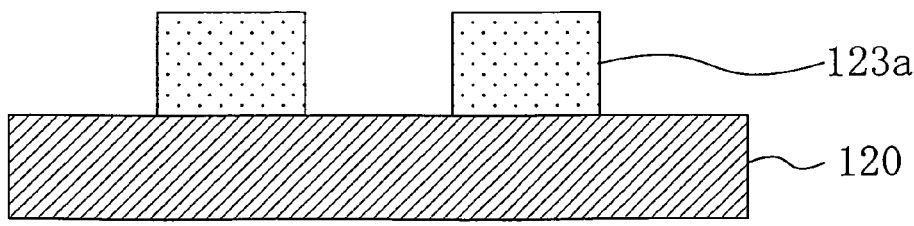

After the pattern exposure, as shown in FIG. 10C, the resist film 123 is baked with a hot plate at a temperature of 110° C. for 60 seconds, and the resultant resist film is developed with a 2.38 wt % tetramethylammonium hydroxide solution (alkaline developer). In this manner, a resist pattern 123a made of an unexposed portion of the resist film 123 and having a line width of 0.09 μm is formed as shown in FIG. 10D.

According to Embodiment 4, since the liquid 121A supplied onto the resist film 123 during the pattern exposure includes no foams, the abnormality of aberration and defocusing of the projection lens 131 can be prevented, and hence, the resist pattern 123a made of the resist film 123 can be formed in a good shape.

Embodiment 5

Now, a pattern formation method using the exposure system according to Modification 1 of Embodiment 3 shown in FIG. 7 will be described as Embodiment 5 with reference to FIGS. 11A through 11D.

First, a positive chemically amplified resist material having the following composition is prepared:

| | | |
|---|---|---|
| Base polymer: | poly((norbornene-5-methylene-t-butylcarboxylate) (50 mol %) – (maleic anhydride) (50 mol %)) | 2 g |
| Acid generator: | triphenylsulfonium triflate | 0.06 g |
| Solvent: | propylene glycol monomethyl ether acetate | 20 g |

Next, as shown in FIG. 1A, the aforementioned chemically amplified resist material is applied on a substrate 120 so as to form a resist film 123 with a thickness of 0.35 μm.

Figure 11A:
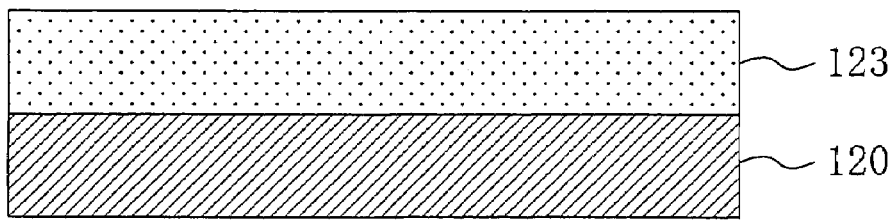
FIGS. 11A, 11B, 11C and 11D are cross-sectional views for showing procedures in a pattern formation method according to Embodiment 5 of the invention.
Figure 11B:
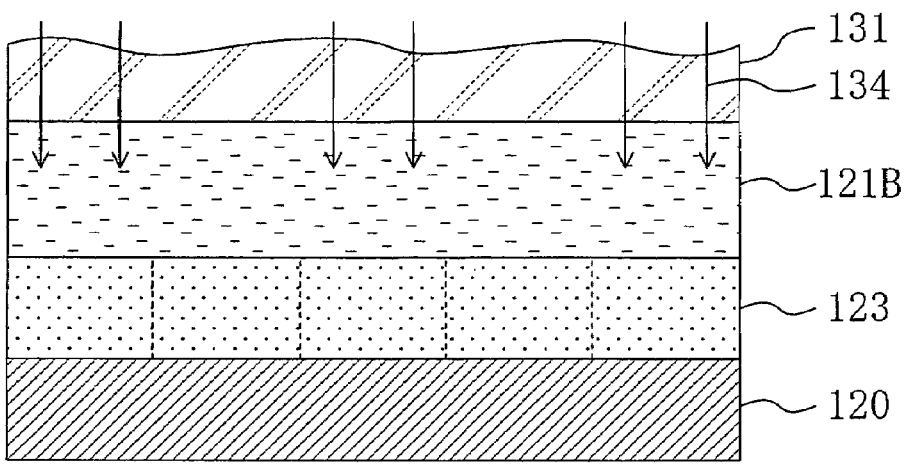

Then, as shown in FIG. 11B, with a liquid 121B of water provided between the resist film 123 and the projection lens 131, pattern exposure is carried out by irradiating the resist film 123 with exposing light 134 of ArF excimer laser with NA of 0.65 through a mask. At this point, as shown in FIG. 7, the liquid 121B is sprayed into the vessel 141 of the liquid supplying section 140 to be stored therein even while it is supplied onto the wafer 120.

Figure 11C:
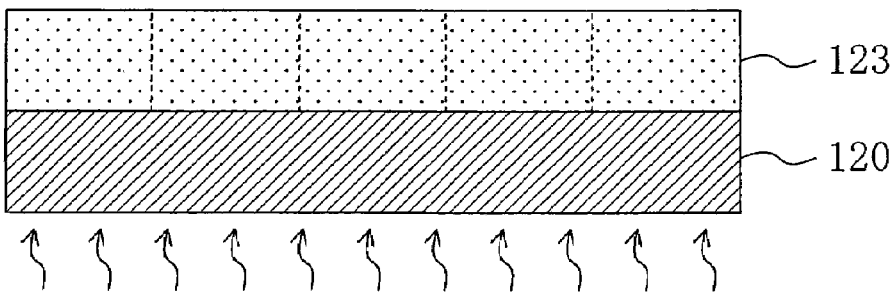
Figure 11D:
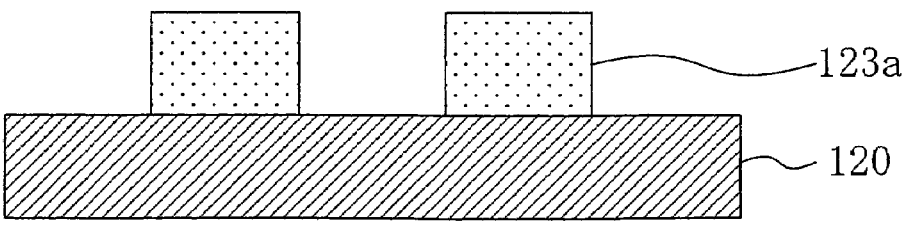

After the pattern exposure, as shown in FIG. 11C, the resist film 123 is baked with a hot plate at a temperature of 110° C. for 60 seconds, and the resultant resist film is developed with a 2.38 wt % tetramethylammonium hydroxide solution (alkaline developer). In this manner, a resist pattern 123a made of an unexposed portion of the resist film 123 and having a line width of 0.09 μm is formed as shown in FIG. 11D.

According to Embodiment 5, since the liquid 121B supplied onto the resist film 123 during the pattern exposure includes no foams, the abnormality of aberration and defocusing of the projection lens 131 can be prevented, and hence, the resist pattern 123a made of the resist film 123 can be formed in a good shape.

Embodiment 6

Now, a pattern formation method using the exposure system according to Modification 2 of Embodiment 3 shown in FIG. 8 will be described as Embodiment 6 with reference to FIGS. 12A through 12D.

First, a positive chemically amplified resist material having the following composition is prepared:

| | | |
|---|---|---|
| Base polymer: | poly((norbornene-5-methylene-t-butylcarboxylate) (50 mol %) – (maleic anhydride) (50 mol %)) | 2 g |
| Acid generator: | triphenylsulfonium triflate | 0.06 g |
| Solvent: | propylene glycol monomethyl ether acetate | 20 g |

Figure 12A:
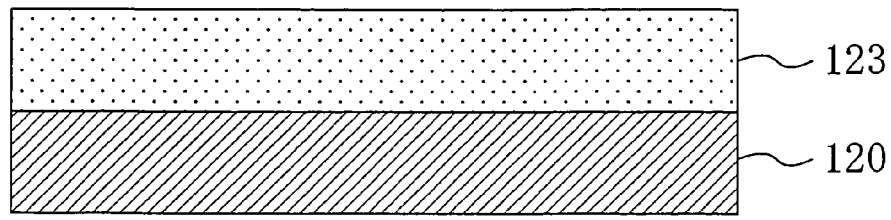
FIGS. 12A, 12B, 12C and 12D are cross-sectional views for showing procedures in a pattern formation method according to Embodiment 6 of the invention.

Next, as shown in FIG. 12A, the aforementioned chemically amplified resist material is applied on a substrate 120 so as to form a resist film 123 with a thickness of 0.35 μm.

Figure 12B:
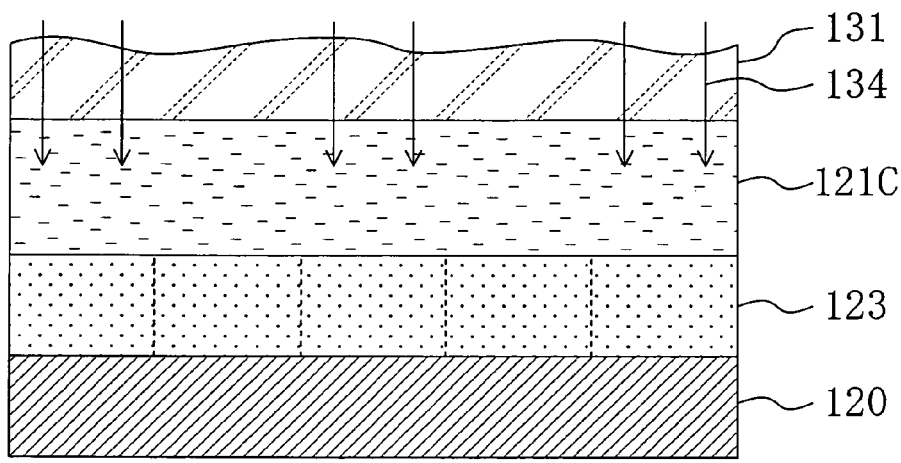

Then, as shown in FIG. 12B, with a liquid 121C of water provided between the resist film 123 and the projection lens 131, pattern exposure is carried out by irradiating the resist film 123 with exposing light 134 of ArF excimer laser with NA of 0.65 through a mask. At this point, as shown in FIG. 8, the liquid 121C is a mixture, obtained in the vessel 141 of the liquid supplying section 140, of liquids having been introduced respectively through the storing nozzle 144 and the storing spray nozzle 143, whereas the liquid 121C is water in this case. It is noted that the liquid 121C may be kept on being sprayed to be stored in the vessel 141 of the liquid supplying section 140 even while it is supplied onto the wafer 120.

Figure 12C:
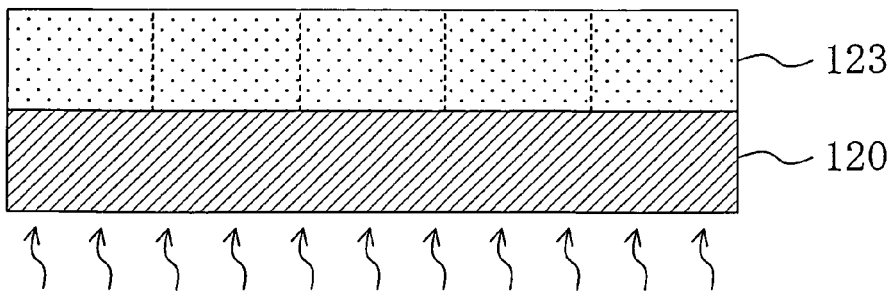
Figure 12D:
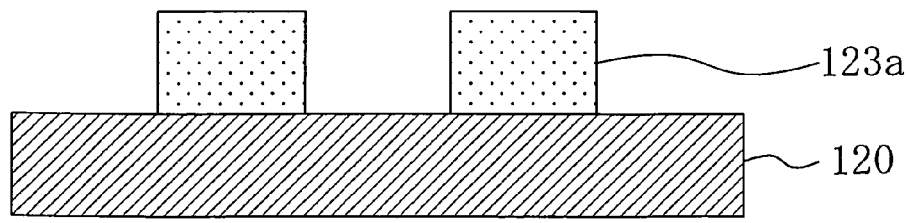
Figure 13A:
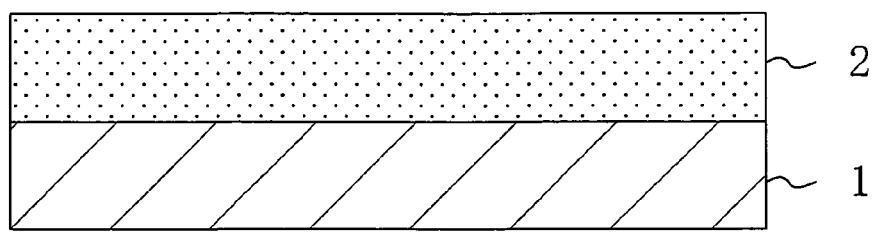
FIGS. 13A, 13B, 13C and 13D are cross-sectional views for showing procedures in a conventional pattern formation method.
Figure 13B:
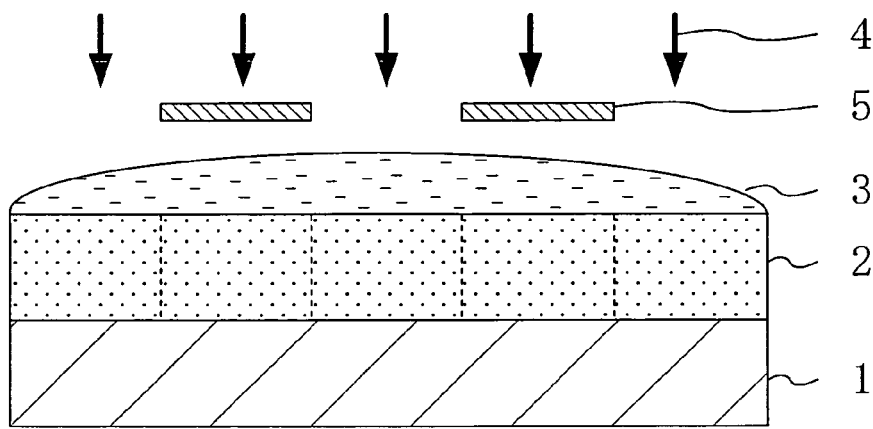
Figure 13C:
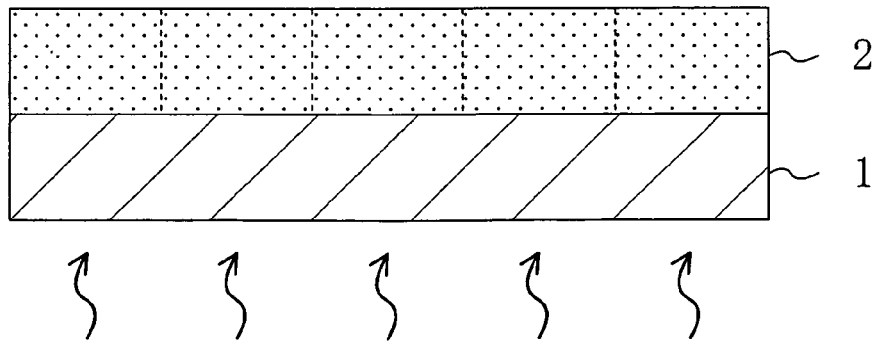
Figure 13D:
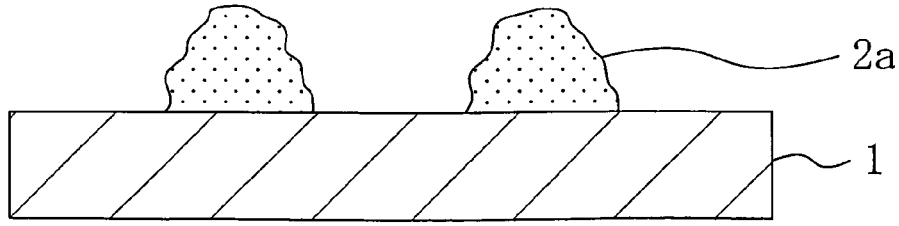

After the pattern exposure, as shown in FIG. 12C, the resist film 123 is baked with a hot plate at a temperature of 110° C. for 60 seconds, and the resultant resist film is developed with a 2.38 wt % tetramethylammonium hydroxide solution (alkaline developer). In this manner, a resist pattern 123a made of an unexposed portion of the resist film 123 and having a line width of 0.09 μm can be formed as shown in FIG. 12D.

According to Embodiment 6, since the liquid 121C supplied onto the resist film 123 during the pattern exposure includes no foams, the abnormality of aberration and defocusing of the projection lens 131 can be prevented, and hence, the resist pattern 123a made of the resist film 123 is formed in a good shape.

In each of Embodiments 4 through 6, the liquid 121A, 121B or 121C preferably includes an antifoaming agent. Thus, foams formed in the liquid can be largely removed by the antifoaming agent, and hence, pattern failure derived from the influence of the foams occurring in the exposure can be further reduced.

As the antifoaming agent, a foam breaker, a foam inhibitor or a defoaming agent may be used. Specifically, silicone oil, fatty acid, phosphoric ester, vegetable fat, glycerol fatty ester, calcium carbonate, magnesium carbonate, lecithin or polyether may be used. The content of such an antifoaming agent is approximately several ppm. through 1%.

Although the ArF excimer laser is used as the exposing light 134, KrF excimer laser, $F_2$ laser, $Kr_2$ laser, ArKr laser, $Ar_2$ laser or $Xe_2$ laser may be used instead.

Also, when the exposing light is vacuum UV such as $F_2$ laser, the immersion liquid may be perfluoropolyether.

What is claimed is:

1. A pattern formation method comprising the steps of:
    forming a resist film on a substrate;
    irradiating selectively said resist film with exposing light with a liquid provided on said resist film; and
    forming a resist pattern by developing said resist film after the pattern exposure,
    wherein the step of performing pattern exposure includes a sub-step of removing a gas included in said liquid provided on said resist film, and
    wherein the sub-step employs at least one of the following methods: a nitrogen dissolving method, a thermal degassing method, a nitrogen gas bubbling method, a film degassing method, a reducer adding method, or a reducing method.

2. The pattern formation method of claim 1, wherein said liquid is composed of water or perfluoropolyether.

3. The pattern formation method of claim 1, wherein said liquid includes an antifoaming agent.

4. The pattern formation method of claim 1, wherein said exposing light is KrF excimer laser, ArF excimer laser, $F_2$ laser, $Kr_2$ laser, ArKr laser, $Ar_2$ laser or $Xe_2$ laser.

5. A pattern formation method comprising the steps of:
    forming a resist film on a substrate;
    irradiating selectively said resist film with exposing light with a liquid provided on said resist film; and
    forming a resist pattern by developing said resist film after the pattern exposure,
    wherein the step of performing pattern exposure includes a sub-step of supplying said liquid onto said resist film and collecting said liquid from on said resist film in such a manner that a flow rate and a flowing direction of said liquid caused on said resist film substantially accord with a movement rate and a moving direction of said stage.

6. The pattern formation method of claim 5, further comprising a step of removing a gas from said liquid having been collected from on said resist film and providing, onto said resist film, said liquid from which said gas has been removed.

7. The pattern formation method of claim 5, wherein said exposing light is KrF excimer laser, ArF excimer laser, $F_2$ laser, $Kr_2$ laser, ArKr laser, $Ar_2$ laser or $Xe_2$ laser.

8. A pattern formation method comprising the steps of:
    forming a resist film on a substrate;
    spraying a liquid to be stored in a bath;
    irradiating selectively said resist film with exposing light with said stored liquid provided on said resist film; and
    forming a resist pattern by developing said resist film after the irradiating.

9. The pattern formation method of claim 8, wherein, in the step of spraying a liquid, said liquid is stored by spraying said liquid on another liquid previously stored in said bath.

10. The pattern formation method of claim 8, wherein the step of spraying a liquid and the step of irradiating are executed in parallel.

11. The pattern formation method of claim 8, wherein said exposing light is KrF excimer laser, ArF excimer laser, $F_2$ laser, $Kr_2$ laser, ArKr laser, $Ar_2$ laser or $Xe_2$ laser.

* * * * *

UNITED STATES PATENT AND TRADEMARK OFFICE
CERTIFICATE OF CORRECTION

PATENT NO. : 7,195,860 B2
APPLICATION NO. : 10/983655
DATED : March 27, 2007
INVENTOR(S) : Masayuki Endo et al.

It is certified that error appears in the above-identified patent and that said Letters Patent is hereby corrected as shown below:

On the title page of the Letters Patent,

Under section "(56) References cited, FOREIGN PATENT DOCUMENTS", delete:

"JP 2003-181260  7/2003
JP 2003-306015  10/2003"

Signed and Sealed this

Fourteenth Day of August, 2007

JON W. DUDAS
*Director of the United States Patent and Trademark Office*